United States Patent [19]
Hine et al.

[11] Patent Number: 5,803,979
[45] Date of Patent: Sep. 8, 1998

[54] TRANSPORT APPARATUS FOR SEMICONDUCTOR WAFERS

[75] Inventors: Derek Hine; Roger Hine, both of Portola Valley; Eric Selvik, San Francisco; Kenneth Lorell, Los Altos; Jeffrey Marical, San Mateo, all of Calif.

[73] Assignee: Hine Design Inc., Sunnyvale, Calif.

[21] Appl. No.: 680,366

[22] Filed: Jul. 15, 1996

[51] Int. Cl.$^6$ ..................................................... B25J 15/06
[52] U.S. Cl. ........................... 134/2; 294/64.1; 294/64.3; 414/222; 414/225; 414/226; 414/676; 414/751
[58] Field of Search ................................ 134/2; 294/64.3, 294/64.1; 414/222, 225, 226, 676, 729, 737, 744.2, 744.5, 744.8, 751; 901/30; 34/58

[56] References Cited

U.S. PATENT DOCUMENTS

| | | | |
|---|---|---|---|
| 4,584,045 | 4/1986 | Richards | 156/345 |
| 4,635,328 | 1/1987 | Palmer | 29/26 |
| 4,744,594 | 5/1988 | Poli et al. | 294/64.1 |
| 4,749,330 | 6/1988 | Hine | 414/744 |
| 4,972,731 | 11/1990 | Akutagawa | 74/479 |
| 5,007,784 | 4/1991 | Genov et al. | 414/225 |
| 5,064,340 | 11/1991 | Genov et al. | 414/744.5 |
| 5,080,549 | 1/1992 | Goodwin et al. | 414/744.8 |
| 5,324,155 | 6/1994 | Goodwin et al. | 414/225 |
| 5,566,466 | 10/1996 | Hearne | 34/58 |

*Primary Examiner*—Laurie Scheiner

[57] ABSTRACT

Transport apparatus for semiconductor wafers which have been subject to chemical mechanical polishing (CMP). The risk of malfunction of an articulated arm fitted with a vacuum chuck can be reduced in a number of different ways. The end effector can be constructed so that it can be easily removed from the arm for cleaning and can be easily replaced in the desired position without the need for adjustment. The arm can include one or more catch chambers into which materials drawn into the vacuum chuck will be deposited, but which will not interrupt the vacuum. The near end of the vacuum passage can be coupled to a source of a cleaning fluid, so that the cleaning fluid can be passed outwards through the vacuum passage to flush out materials drawn into the vacuum passage through the chuck.

22 Claims, 2 Drawing Sheets

TRANSPORT APPARATUS FOR SEMICONDUCTOR WAFERS

BACKGROUND OF THE INVENTION

Field of the Invention

This invention relates to the transport of semiconductor wafers.

Introduction to the Invention

It is well known to make use of articulated arms to transport silicon wafers (and other semiconductor wafers) from one location to another, e.g. from one work station to another, or between a cassette and a work station. The articulated arm comprises an end effector which secures the wafer to the arm while the wafer is being transported and releases it at the new location. Often, the end effector comprises a vacuum chuck. Reference may be made for example to U.S. Pat. Nos. 4,584,045, 4,749,330, 5,007,784 and 5,064,340. The disclosure of each of those patents is incorporated herein by reference for all purposes.

A recent development in the processing of semiconductor wafers is the treatment of wafers, between processing steps, to render them precisely planar. This step, which is often referred to as chemical mechanical polishing (CMP), involves the removal of material through a combination of chemical and abrasive action.

SUMMARY OF THE INVENTION

We have found that when known arms having vacuum chucks are used to transport wafers which have been subject to CMP, they soon fail to operate smoothly and efficiently. We have found that at least part of this problem results from residues and excess treatment materials being drawn into the arm through the vacuum chuck. We have discovered, in accordance with the present invention, a number of expedients which can be used, individually or in any combination, to mitigate this problem. One such expedient is for the readily removable for cleaning and (b) readily replaceable in the correct position without the need for adjustment. A second expedient is for the arm to include one or more catch chambers into which solid and/or liquid materials, drawn into the arm through the vacuum chuck, will be deposited, but which will not interrupt the vacuum line. A third expedient is for the fixed end of the arm to be coupled to a source of a cleaning fluid, so that at appropriate intervals the cleaning fluid can be passed outwards through the vacuum passage to remove foreign materials from the passage.

In a first preferred aspect, this invention provides an apparatus for transporting a semiconductor wafer from one location to another, the apparatus comprising (1) a base;

(2) an articulated arm comprising two or more arm members which (a) are rotatably secured together and (b) comprise (i) a near end member which is rotatably secured to the base and (ii) a far end member remote from the base;

(3) an end effector which (a) is removeably and replaceably secured to the far end member of the articulated arm, (b) has a predetermined spatial relationship to the articulated arm, and (c) comprises a vacuum chuck for a semiconductor wafer;

the end effector and the far end member of the articulated arm including guides which ensure that when the end effector has been removed from the articulated arm and is being replaced on the articulated arm, it is replaced in the predetermined spatial relationship; and (4) a vacuum passage which has (a) a near end at the base, and (b) a far end at the vacuum chuck, so that a reduced gas pressure at the near end of the passage causes a vacuum to be exerted at the vacuum chuck.

In a second preferred aspect, this invention provides an apparatus for transporting a semiconductor wafer from one location to another, the apparatus comprising (1) a base;

(2) an articulated arm comprising two or more arm members which (a) are rotatably secured together and (b) comprise (i) a near end member which is rotatably secured to the base and (ii) a far end member remote from the base;

(3) an end effector which (a) is secured to the far end member of the articulated arm and (b) comprises a vacuum chuck for a semiconductor wafer;

(4) a vacuum passage which has (a) a near end at the base and, (b) a far end at the end effector, so that a reduced gas pressure at the near end of the passage causes a vacuum to be exerted at the vacuum chuck; and (5) a catch chamber which forms part of the vacuum passage and which, when a vacuum is exerted on the vacuum passage, retains liquid and solid materials drawn into the vacuum passage through the vacuum chuck.

In a third preferred aspect, this invention provides an apparatus for transporting a semiconductor wafer from one location to another, the apparatus comprising (1) a base;

(2) an articulated arm comprising two or more arm members which (a) are rotatably secured together and (b) comprise a near end member which is (i) rotatably secured to the base and (ii) a far end member remote from the base;

(3) an end effector which (a) is secured to the far end member of the articulated arm, and (b) comprises a vacuum chuck for a semiconductor wafer;

(4) a vacuum passage which has (a) a near end at the base, and (b) a far end at the vacuum chuck, so that a reduced gas pressure at the near end of the passage causes a vacuum to be exerted at the vacuum chuck; and (5) means for passing a cleaning fluid from the near end to the far end of the vacuum passage.

The invention further includes a method of manufacturing a semiconductor wafer which comprises the steps in sequence of (A) subjecting a semiconductor wafer to chemical mechanical polishing at a work station;

(B) removing the wafer from the work station by means of an apparatus of the invention;

(C) releasing the wafer at a new location; and (D) cleaning the apparatus by one or more of the following steps (I) removing the end effector from the articulated arm; cleaning the end effector; and replacing the end effector in the predetermined spatial relationship;

(II) cleaning the catch chamber; and (III) passing a cleaning fluid from the near end to the far end of the vacuum passage.

BRIEF DESCRIPTION OF THE DRAWING

The invention is illustrated in the accompanying drawings, in which.

DETAILED DESCRIPTION OF THE INVENTION

Figure 1:
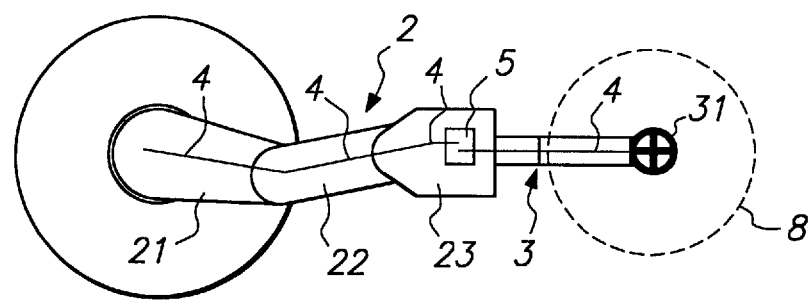
FIGS. 1 and 2 are diagrammatic plan and side views of an apparatus of the invention.

In the description below, reference will be made to a number of specific features of the apparatus and methods of the invention. It is to be understood that these features, even if described in a particular context, e.g. as part of one of the Figures, can be used in any apparatus of the invention, either individually or in any appropriate combination.

Articulated Arms

As indicated above, articulated arms fitted with vacuum chucks are well known to those skilled in the art and do not, therefore, require further description here.

Replaceable End Effectors

In known apparatus, tools are needed to remove the end effector from the articulated arm, and great care is needed to ensure that the end effector is replaced in the correct spatial relationship with the arm.

In accordance with the first preferred aspect of the invention, the end effector and the far end member of the arm and the end effector are equipped with guides so that the end effector, after being removed from the arm, can only be replaced on the arm in the desired predetermined spatial relationship with the arm. The term "guide" is used herein broadly to include any groove, detent, stop, pin or other physical feature. This makes it possible to remove the end effector as often as is desirable, so that it can be cleaned, and to replace it without difficulty in the correct linear and angular position. Preferably the end effector can be removed from and replaced on, the arm manually, i.e. without the need for tools, for example by means of a snap lock system. We have obtained excellent results using an end effector having a cylindrical shaft which slides over a cylindrical body in the far end member of the arm, the end effector having a slot which mates with a spring-loaded pin on the far end member when the end effector is in the desired position. Generally, the end effector can be rotated through an angle of 180° so that a wafer can if desired be placed upside down in a new location (or replaced upside down in the same location).

Catch Chambers The use of a catch chamber is an effective way of lessening the ill effects of particulate and liquid materials which are drawn into the vacuum passage through the vacuum chuck. Preferably, the catch chamber is placed as near to the vacuum chuck as is consistent with the required dimensions of the end effector and of the far end member of the arm. Many end effectors must be able to remove a wafer from a cassette, in which case it is difficult or impossible to place the catch chamber in that part of the arm and end effector which must fit into the limited space available between wafers in a cassette. Generally a single catch chamber is sufficient, but the invention includes the possibility of using two or more catch chambers at different points along the vacuum passage. The shape and dimensions of the catch chamber, the position of the inlet (i.e. the passage leading to the vacuum chuck), and the position of the outlet (i.e. the passage leading to the vacuum pump) should be such that when solid and/or liquid materials are drawn into the vacuum chamber through the inlet, at least some, and preferably substantially all, of those materials drop to the floor of the catch chamber, where they are retained but do not interrupt the vacuum which is being drawn on the chuck. Thus, in one embodiment, the catch chamber has a floor, the inlet is above the floor and the outlet is above the inlet. For example, the inlet can be provided by a substantially vertical tube which is spaced apart from the floor of the catch chamber by a distance of at least 0.05 inch (1.25 mm), preferably 0.07 to 0.20 inch (1.8 to 0.51 mm). Preferably the floor of the catch basin is provided by a floor member which can be removed, so that materials which have accumulated in the catch chamber can be removed by removing and cleaning the floor member, which is then replaced.

Cleaning Fluids Another way of lessening the ill effects of materials drawn into the vacuum passage is to pass a cleaning fluid from the near end to the far end of the vacuum passage, thus flushing the materials out of the vacuum chuck. The cleaning fluid is preferably an aqueous liquid, e.g. water or an aqueous solution containing an ingredient which has some desired effect on one or more of the materials to be removed. In many cases the best results are obtained by first passing an aqueous cleaning liquid through the passage and then passing compressed air through the passage to remove residues of the cleaning fluid. When the apparatus includes a catch chamber, the amount of cleaning liquid used is preferably at least 1.5 times, e.g. 2 to 6 times, the volume of the catch basin. Thus, a preferred apparatus of the invention includes a manifold from which each of (a) a cleaning liquid under pressure, e.g. water, (b) a gas under pressure, e.g. air, and (c) a reduced gaseous pressure, can alternatively be supplied to the near end of the vacuum passage.

Figure 2:
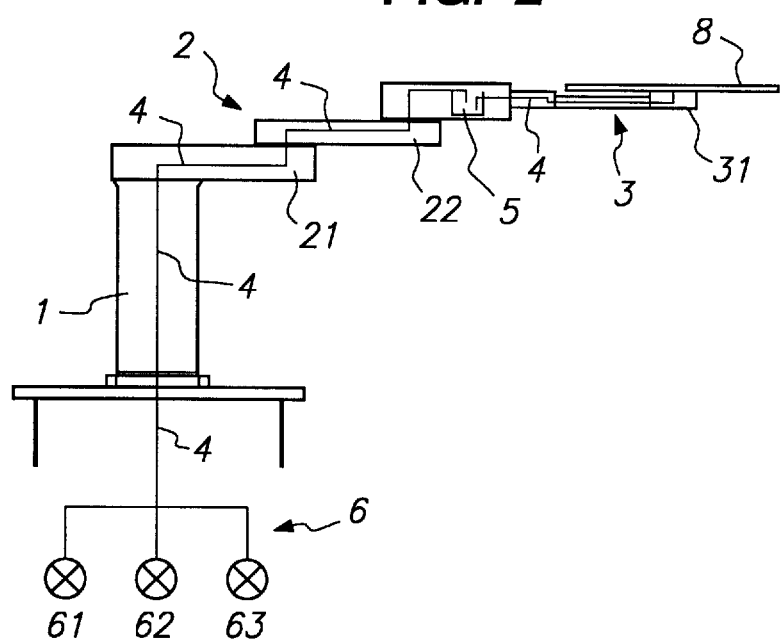

Referring now to the drawings, FIGS. 1 and 2 show an apparatus of the invention which comprises a base 1; an articulated arm 2 comprising three arm members which are rotatably secured together, namely near end member 21 which is rotatably secured to the base 1, a center member 22, and a far end member 23; and an end effector 3 which is secured to far end member 23 and comprises a vacuum chuck 31, on which a wafer 8 is held. A vacuum passage 4 runs from the base 1 to the vacuum chuck 31, and at the base is connected to a manifold 6 having valves 61, 62 and 63 through which a cleaning liquid under pressure, a gas under pressure, or a reduced gas pressure can alternatively be supplied to the vacuum passage 4. In the far end arm member, the passage 4 includes a catch chamber.

Figure 3:
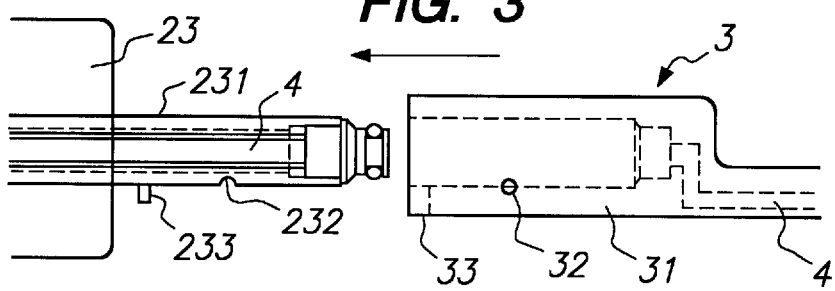
FIGS. 3 and 4 are diagrammatic plan and side views, partly in cross-section, of a part of the apparatus of FIGS. 1 and 2, showing how the end effector engages the end of the articulated arm.
Figure 4:
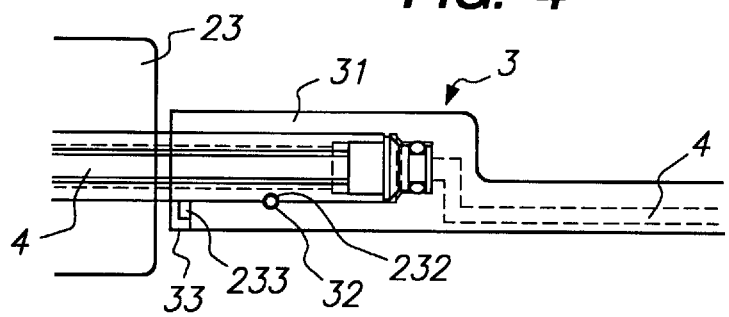

FIGS. 3 and 4 show how the end effector 3 is removeably and replaceably secured to the far end arm member 23. The end effector has a cylindrical bore 31 which slides over the cylindrical end 231 of the far end member 23, until locating slot 33 on the end effector engages alignment guide 233 on the far end arm member. When the correct position has been reached, spring-loaded pin 32 on the end effector enters locating notch 232 on the far end arm member, thus securing the end effector and the far end arm member to each other in the desired predetermined spatial relationship.

Figure 5:
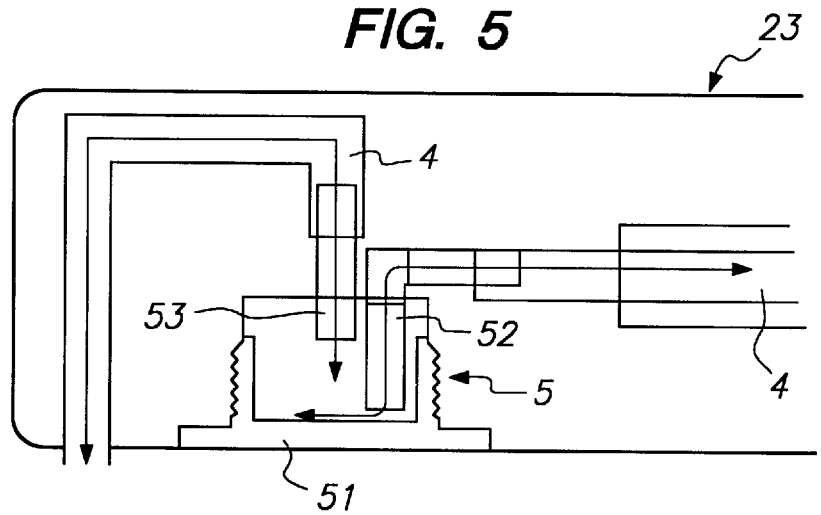
FIG. 5 is a diagrammatic cross-section through a part of the far end member of the articulated arm of the apparatus of FIGS. 1 and 2, showing the catch chamber therein.

FIG. 5 shows more detail of the catch chamber 5. The chamber has a floor member 51 which can be unscrewed, so that it can be removed for cleaning. The outlet of the catch chamber is provided by a vertical tube 53 which terminates in the top of the chamber. The inlet of the catch chamber is provided by a second vertical tube 52 which terminates a little way above the floor of the chamber. In this way solid and liquid materials drawn into the vacuum passage at the vacuum chuck are deposited in the chamber so that they cannot enter the remainder of the vacuum passage, but the vacuum is not interrupted.

We claim:

1. Apparatus for transporting a semiconductor wafer from one location to another, the apparatus comprising
   (1) a base;
   (2) an articulated arm comprising two or more arm members which (a) are rotatably secured together and (b) comprise (i) a near end member which is rotatably secured to the base and (ii) a far end member remote from the base;

(3) an end effector which (a) is removably and replaceably secured to the far end member of the articulated arm, (b) has a predetermined spatial relationship to the articulated arm, and (c) comprises a vacuum chuck for a semiconductor wafer;

the end effector and the far end member of the articulated arm including guides which ensure that when the end effector has been removed from the articulated arm and is being replaced on the articulated arm, it is replaced in the predetermined spatial relationship; and (4) a vacuum passage which has (a) a near end at the base, and (b) a far end at the vacuum chuck, so that a reduced gas pressure at the near end of the passage causes a vacuum to be exerted at the vacuum chuck.

2. Apparatus according to claim 1 wherein the end effector can be removed from, and replaced onto, the far end of the articulated arm manually and without the aid of tools.

3. Apparatus according to claim 2 wherein the end effector is secured to the far end of the articulated arm by a spring-loaded pin.

4. Apparatus according to claim 1 wherein the vacuum passage includes a catch chamber having (a) a floor, (b) an inlet which is above the floor, and (c) an outlet which is above the floor.

5. Apparatus according to claim 4 wherein the inlet of the catch chamber is provided by a substantially vertical tube which is spaced apart from the floor of the catch chamber by a distance of at least 0.05 inch (1.25 mm), and the outlet of the catch chamber is above the inlet.

6. Apparatus according to claim 4 wherein the catch chamber is in the far end member of the articulated arm.

7. Apparatus according to claim 4 wherein the catch chamber includes a floor member which can be removed.

8. Apparatus according to claim I which includes (5) means f or passing a cleaning fluid from the near end to the far end of the vacuum passage.

9. Apparatus according to claim 8 which includes a manifold from which each of (1) an aqueous liquid under pressure, (2) a gas under pressure, and (3) a reduced gaseous pressure, can alternatively be supplied to the near end of the vacuum passage.

10. Apparatus for transporting a semiconductor wafer from one location to another, the apparatus comprising (1) a base;
(2) an articulated arm comprising two or more arm members which (a) are rotatably secured together and (b) comprise (i) a near end member which is rotatably secured to the base and (ii) a far end member remote from the base;
(3) an end effector which (a) is secured to the far end member of the articulated arm and (b) comprises a vacuum chuck for a semiconductor wafer;
(4) a vacuum passage which has (a) a near end at the base and, (b) a far end at the end effector, so that a reduced gas pressure at the near end of the passage causes a vacuum to be exerted at the vacuum chuck; and
(5) a catch chamber which forms part of the vacuum passage and which, when a vacuum is exerted on the vacuum passage, retains liquid and solid materials drawn into the vacuum passage through the vacuum chuck.

11. Apparatus according to claim 10 wherein the catch chamber has (a) a floor, (b) an inlet which is above the floor, and (c) an outlet which is above the floor.

12. Apparatus according to claim 11 wherein the inlet is provided by a substantially vertical tube which is spaced apart from the floor of the catch chamber by a distance of at least 0.05 inch (1.25 mm).

13. Apparatus according to claim 10 wherein the catch chamber includes a floor portion which can be removed.

14. Apparatus according to claim 10 which includes (6) means for passing a cleaning fluid from the near end to the far end of the vacuum passage.

15. Apparatus according to claim 14 which includes a manifold from which each of (1) an aqueous liquid under pressure, (2) a gas under pressure, and (3) a reduced gaseous pressure, can alternatively be supplied to the near end of the vacuum passage.

16. Apparatus for transporting a semiconductor wafer from one location to another, the apparatus comprising (1) a base;
(2) an articulated arm comprising two or more arm members which (a) are rotatably secured together and (b) comprise (i) a near end member which is rotatably secured to the base and (ii) a far end member remote from the base;
(3) an end effector which (a) is secured to the far end member of the articulated arm, and (b) comprises a vacuum chuck for a semiconductor wafer;
(4) a vacuum passage which has (a) a near end at the base, and (b) a far end at the vacuum chuck, so that a reduced gas pressure at the near end of the passage causes a vacuum to be exerted at the vacuum chuck; and
(5) means for passing a cleaning fluid from the near end to the far end of the vacuum passage.

17. Apparatus according to claim 16 wherein the cleaning fluid comprises an aqueous liquid.

18. Apparatus according to claim 16 wherein the cleaning fluid comprises a gas.

19. Apparatus according to claim 16 which includes a manifold from which each of (1) an aqueous liquid under pressure, (2) a gas under pressure, and (3) a reduced gaseous pressure, can alternatively be supplied to the near end of the vacuum passage.

20. A method of manufacturing a semiconductor wafer which comprises the step in sequence of (A) subjecting a semiconductor wafer to chemical mechanical polishing at a work station;
(B) removing the wafer from the work station by means of an apparatus as defined in claim 1;
(C) releasing the wafer at a new location;
(D) removing the end effector from the articulated arm;
(E) cleaning the end effector; and
(F) replacing the end effector in the predetermined spatial relationship.

21. A method of manufacturing a semiconductor wafer which comprises the step in sequence of (A) subjecting a semiconductor wafer to chemical mechanical polishing at a work station;
(B) removing the wafer from the work station by means of an apparatus as defined in claim 10;
(C) releasing the wafer at a new location; and
(D) cleaning the catch chamber.

22. A method of manufacturing a semiconductor wafer which comprises the step in sequence of (A) subjecting a semiconductor wafer to chemical mechanical polishing at a work station;
(B) removing the wafer from the work station by means of an apparatus as defined in claim 16;
(C) releasing the wafer at a new location; and
(D) passing a cleaning fluid from the near end to the far end of the vacuum passage.

* * * * *